US006552564B1

(12) United States Patent
Forbes et al.

(10) Patent No.: US 6,552,564 B1
(45) Date of Patent: Apr. 22, 2003

(54) TECHNIQUE TO REDUCE REFLECTIONS AND RINGING ON CMOS INTERCONNECTIONS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/385,383

(22) Filed: Aug. 30, 1999

(51) Int. Cl.$^7$ ............................................. H03K 19/092
(52) U.S. Cl. ........................... 326/30; 326/101; 333/32; 333/247
(58) Field of Search ............................. 326/30, 83, 82, 326/86, 101–103, 26; 333/32, 246, 247

(56) References Cited

U.S. PATENT DOCUMENTS

| | | | | |
|---|---|---|---|---|
| 4,649,296 A | * | 3/1987 | Shoji ........................ | 326/121 |
| 5,548,226 A | * | 8/1996 | Takekuma et al. ......... | 326/30 |
| 6,046,653 A | * | 4/2000 | Yamada .................... | 257/723 |
| 6,271,678 B1 | * | 8/2001 | Sochoux ................... | 326/30 |

OTHER PUBLICATIONS

Edelstein et al; "Full Cooper Wiring in a Sub–0.25 μm CMOS ULSI Technology"; Tech. Digest of 1997 IEDM; pp. 773–776.

Venkatesan et al.; "A High Performance 1.8V, 0.20 μm CMOS Technology with Copper Metallization"; Tech. Digest of 1997 IEDM; pp. 769–772.

Matsuura et al.; "A Highly Reliable Self–planarizing Low–k Internal Dielectric for Sub–quarter Micron Interconnects"; Tech. Digest of 1997 IEDM; pp. 785–788.

Aoki et al.; "A Degradation–Free Cu/HSQ Damascene Technology using Metal Mask Patterning and Post–CMP Cleaning by Electrolytic Ionized Water"; Tech. Digest of 1997 IEDM; pp. 777–781.

Rabaey; "Digital integrated Circuits", A Design Perspective, Prentice Hall Electronics and VSLI Series 1996; pp. 482–493.

* cited by examiner

*Primary Examiner*—Don Le
(74) *Attorney, Agent, or Firm*—Dickstein Shapiro Morin & Oshinsky LLP

(57) ABSTRACT

The present invention provides a method and apparatus, for integrated circuit or printed circuit board interconnections, which is able to minimize the reflections and ringing with minimal delay of signals which are propagated through transmission lines to destination points within the circuit or board. The invention utilizes interconnection lines which are designed to have a resistivity, line length, and line cross sectional area which produces a resistance of the interconnection line which will minimize the ringing and reflections with minimal delay of the signal propagated to the destination points to insure signal quality.

13 Claims, 6 Drawing Sheets

TECHNIQUE TO REDUCE REFLECTIONS AND RINGING ON CMOS INTERCONNECTIONS

FIELD OF THE INVENTION

This invention relates to interconnections within a computer, in particular, to a method and apparatus capable of minimizing reflections, ringing, and delay on long CMOS interconnections in an integrated circuit, between integrated circuits, and between integrated circuits and other circuits.

BACKGROUND OF THE INVENTION

Recent efforts in interconnections have revolved around minimizing the resistivity of the metals, in particular copper metallurgy for CMOS integrated circuits, used in interconnections. The problem is that minimizing the resistivity on long interconnection lines is not always the optimum solution when signal quality is also an important factor. The use of long interconnection lines where the resistivity is minimized may lead to problems with ringing and reflections on the line.

A typical long interconnection line, long being defined as an interconnection line of about 1 cm long or longer, would be a clock distribution line which is used to send clock signals to destination points within an integrated circuit or printed circuit board. Clock signal delay or skew, caused by the characteristics of the distribution line, is an important factor in the transmission of clock signals and for this reason many interconnection or distribution lines attempt to minimize resistivity. However, if signal quality at the destination point is important then consideration must also be given to minimize the reflections and ringing along the line.

FIG. 1 illustrates an interconnection which incorporates a signal source 5 which has an output impedance Zs, a long interconnection line 6, and a destination point D1. The long interconnection line 6 has an overall impedance Zo shown as line resistance $R_L$, inductance $L_L$, and capacitance $C_L$. The long interconnection line 6 begins at node N2 and terminates at node N3. Connected to node N3 is a termination line with a small capacitance $C_S$ and destination point D1.

Typically, only an interconnection line 6 with minimal resistivity would be used to reduce or minimize signal delay or skew. However, an interconnection line where the resistivity is minimized would lead to potential ringing and reflection problems, which ultimately detract from the quality of the signal received. The signal quality is typically not addressed by conventional interconnection line circuits.

SUMMARY OF THE INVENTION

The problems outlined above are in large part solved by the invention which reduces reflections and ringing on CMOS interconnections by altering the geometry of the interconnection lines to obtain interconnection line characteristics which minimize reflections, ringing and delay.

Minimizing the resistivity on long interconnection lines may lead to problems with ringing and reflections on the line. As will be discussed in further detail below, the optimum choice for a long interconnection line is a line where the reflection signals at the source end N2 are attenuated by a round trip transit over the length of the line. Although for signal delay purposes the minimization of line resistivity is favorable, making the line resistance larger can improve signal quality. Therefore interconnection line characteristics and the associated geometry of the interconnection lines are considered to obtain interconnection line characteristics which will insure proper signal attenuation and signal quality.

The foregoing and other features and advantages of the invention will be more clearly understood from the following detailed description of the invention which is provided in conjunction with the accompanying drawings.

DETAILED DESCRIPTION OF THE PREFERRED EMBODIMENTS

The present invention will now be described in connection with FIGS. 1–6. Other embodiments may be utilized and structural or logical changes may be made to the disclosed embodiments and equivalents substituted without departing from the spirit of scope of the present invention.

Figure 1:
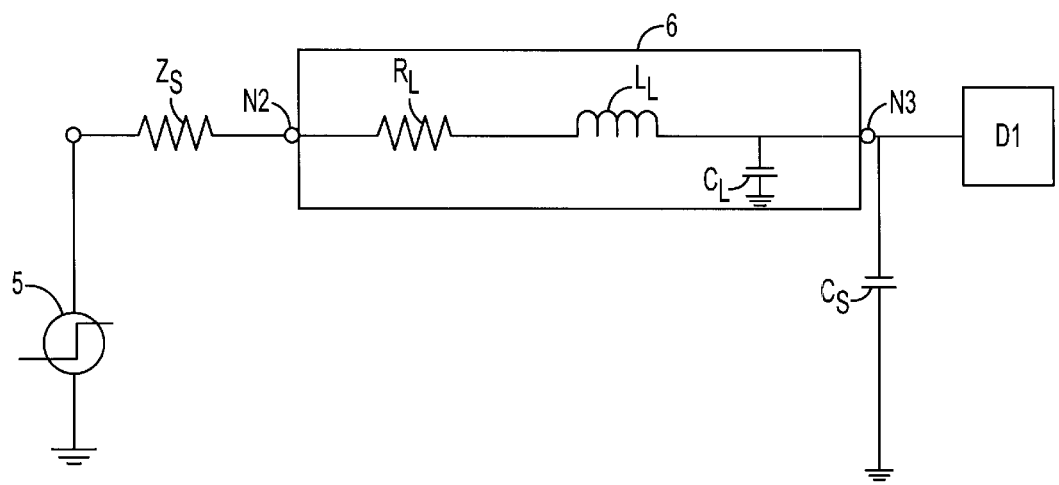
FIG. 1 is a schematic diagram of circuit with an interconnection line.

Referring to FIG. 1, a circuit is shown which incorporates a signal source 5 which has an output impedance Zs, a long interconnection line 6, and a destination point D1. The long interconnection line 6 has an overall impedance Zo shown as line resistance $R_L$, inductance $L_L$, and capacitance $C_L$. The long interconnection line 6 begins at node N2 and terminates at node N3. Connected to node N3 is a termination line with a small capacitance $C_s$.

A signal generated by signal source 5 is transmitted along the long interconnection line 6, from node N2 to node N3, and ultimately to a destination point D1. There is a reflection at node N3 back towards N2 due to the fact that there is a small capacitance $C_s$ coupled to node N3. The reflected signal will be received back at node N2 and, depending on the impedance of the line Zo and the impedance of the source Zs, the reflected signal will either be reflected again, back towards node N3, or there will be no reflection at all.

There are two techniques to minimize the reflected signal from N3 to N2 to prevent those same reflected signals from being re-reflected back to node N3. The first technique it to have the source impedance Zs match the line impedance Zo. However, many signal sources 5 have drivers which have a low impedance Zs which will therefore cause a large reflection at node N2. Also, since reflections at the receiving end N3 are an inherent feature of CMOS circuits the optimum solution is to attenuate the reflected signals before they reflect again at node N2 and appear back at the receiving end N3. In order to reduce and minimize reflections and ringing the reflected signals from the source end N2 must be minimized.

If the long interconnection lines 6 are driven with a large channel width CMOS driver as source 5, which have a low output impedance Zs, then it can be shown that the optimum choice would be for the resistance of the line R to have a resistance which equals $(4L/C)^{1/2}$, where L is the inductance of the line and C is the capacitance of the line, that is, $R=(4L/C)^{1/2}$. This is further explained with reference to FIGS. 2–4.

Figure 2:
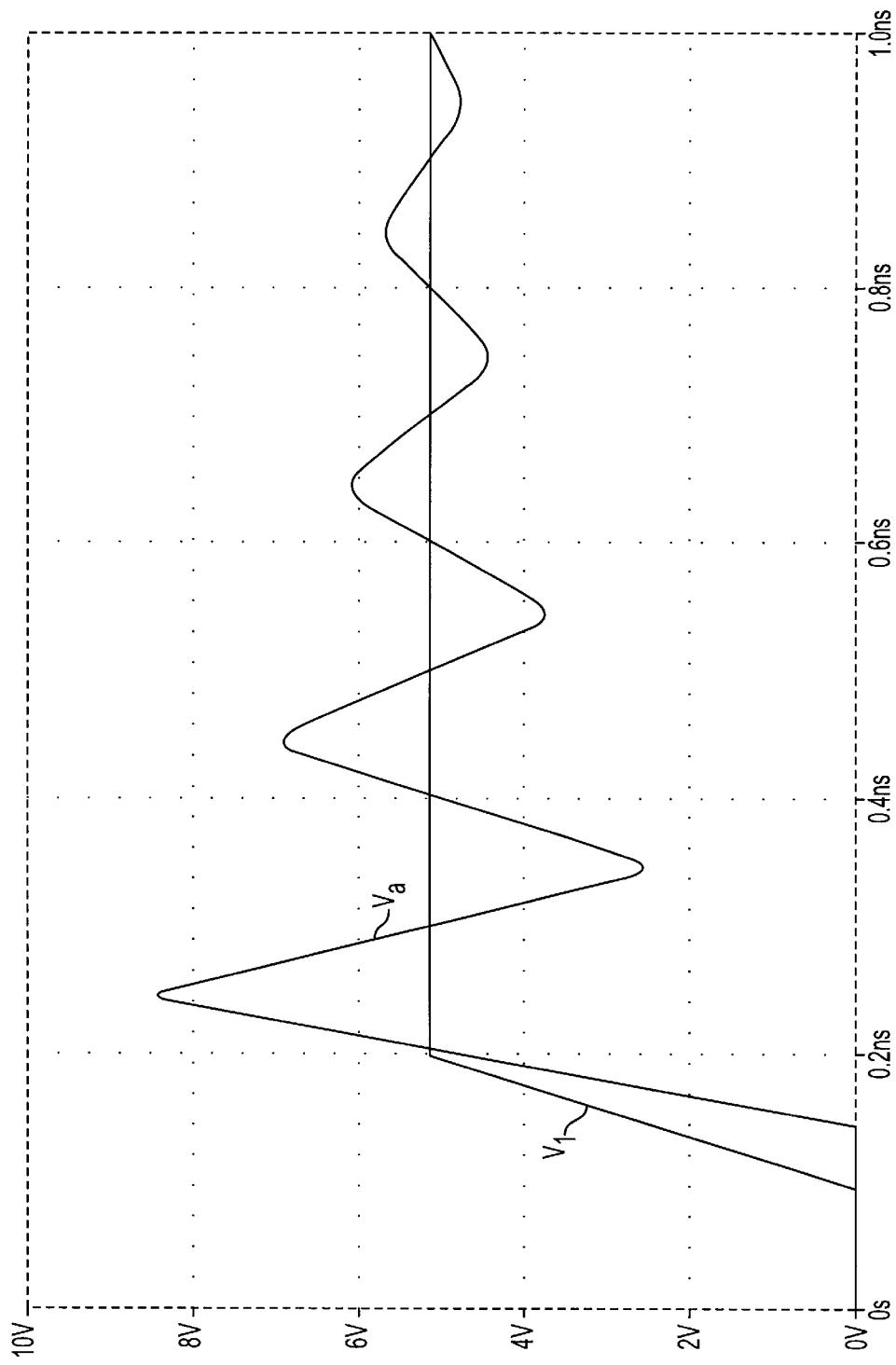
FIG. 2 is a graph illustration of a signal propagated through an interconnection line circuit which has a characteristic of an under-damped system.
Figure 3:
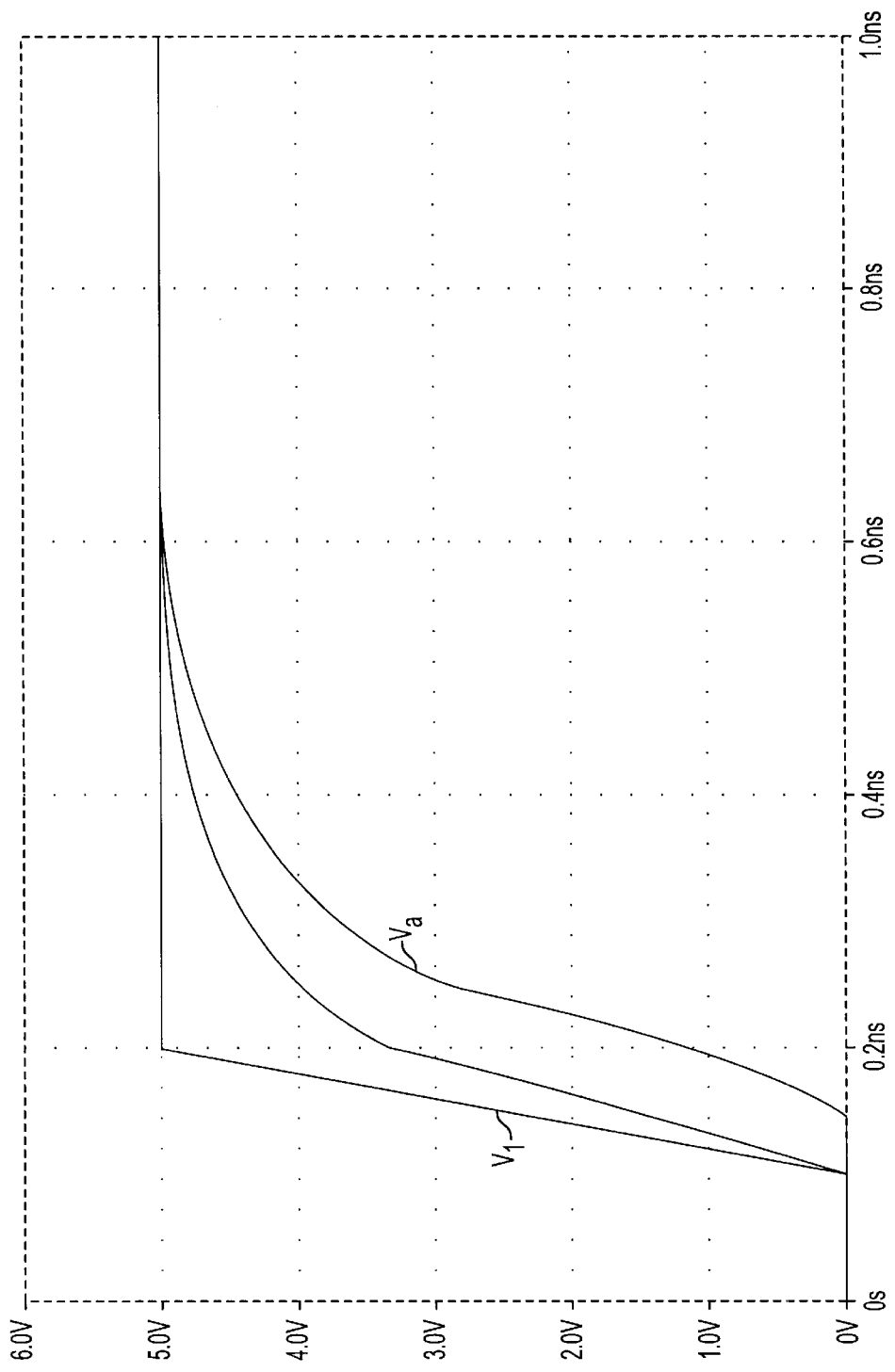
FIG. 3 is a graph illustration of a signal propagated through an interconnection line circuit which has a characteristic of an over-damped system.
Figure 4:
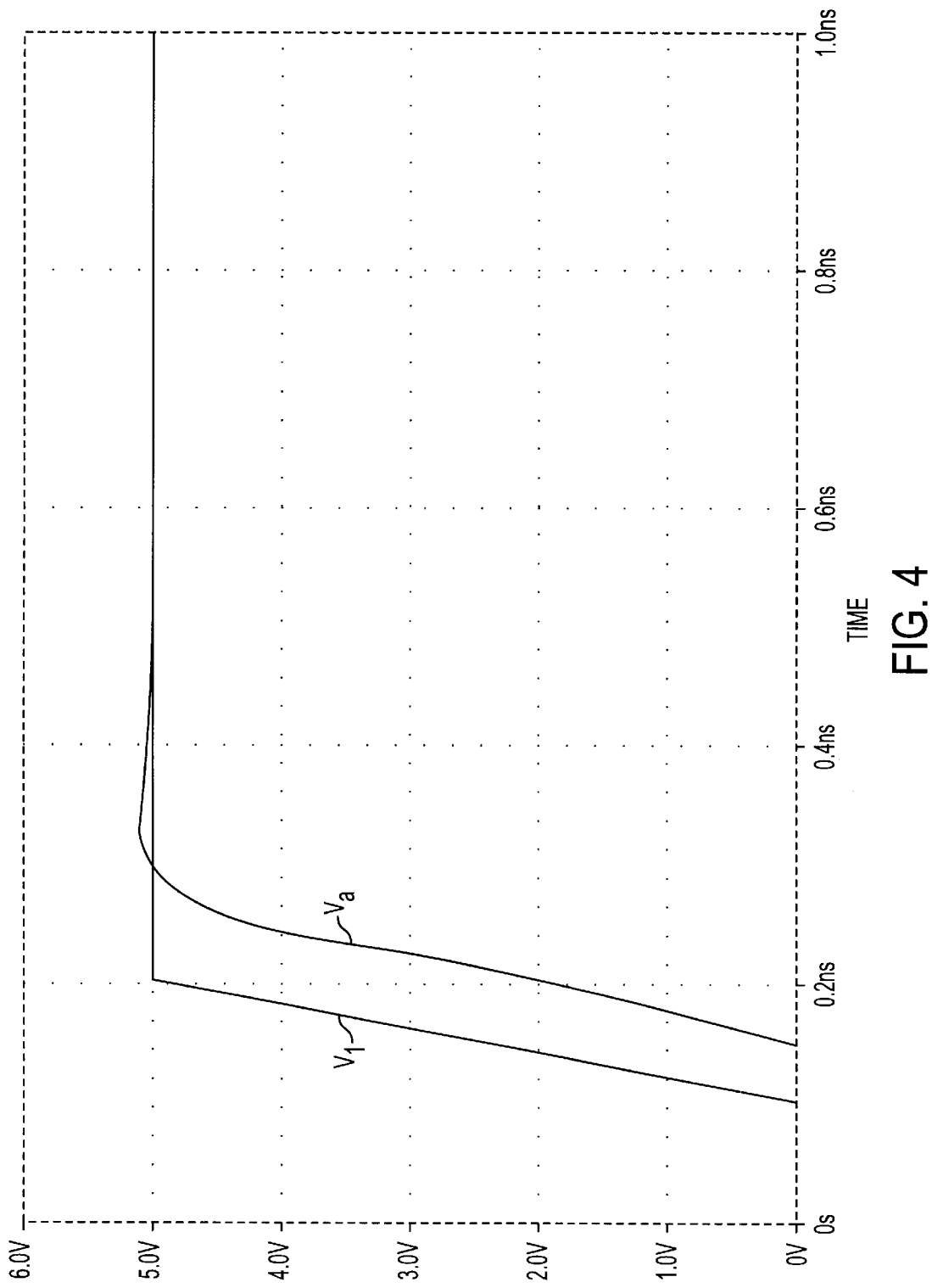
FIG. 4 is a graph illustration of a signal propagated through an interconnection fine circuit which has a characteristic of a critically damped system.

FIGS. 2–4 display a classical problem seen in all fields of engineering, characterized as an over-damped, critically damped, and under-damped system. Specifically FIGS. 2–4 display the reading of the signal Va, at node N3, as compared to the input signal V1 to the interconnection line 6 circuit of FIG. 1.

FIG. 2 represents the value of the signal Va, at node N3, propagated through the circuit depicted in FIG. 1. More specifically, FIG. 2 represents the case where there are reflections at the source end, node N2, and where the resistance of the interconnection line 6 is small, so that there is not much attenuation of the reflected signal before it reaches node N3. Expressed in other terms the resistance R of the interconnection line 6 is much smaller than $(4L/C)^{1/2}$, where L is the inductance of the line and C is the capacitance of the line, that is, $R<<(4L/C)^{1/2}$. As can be seen from FIG. 2, the signal Va does not stay steady or match the input signal V1. The signal Va in FIG. 2 is characteristic of an under-damped system.

FIG. 3 represents the reading of the signal Va, at node N3, propagated through the circuit depicted in FIG. 1. More specifically, FIG. 3 represents the case where the reflections are minimized at the source end, node N2, by having a source with a large output impedance Zs and also considerable signal attenuation down the interconnection line 6 by having a large line resistance R. Expressed in other terms, the resistance R of the interconnection line 6 is much larger than $(4L/C)^{1/2}$, where L is the inductance of the line and C is the capacitance of the line, that is, $R>>(4L/C)^{1/2}$. As can be seen from FIG. 3, the signal Va is heavily delayed and slow to rise as compared to the input signal V1. The signal Va in FIG. 3 is characteristic of an over-damped system.

FIG. 4 represents the value of the signal Va, at node N3, propagated through the circuit depicted in FIG. 1. More specifically, FIG. 4 represents the case where there are reflections at the source end, node N2, which are reflected but there is sufficient attenuation of the reflected signals before they are received at node N3. Therefore, this system has a sufficient line resistance R to prevent the reflected signals from being sent all the way back to node N3. Expressed in other terms the resistance R of the interconnection line 6 is very close to or equal to $(4L/C)^{1/2}$, where L is the inductance of the line and C is the capacitance of the line, that is, $R=(4L/C)^{1/2}$. As can be seen in FIG. 4, the signal Va is delayed about 50 ps, the time it takes to travel down the interconnection line 6, but that the signal follows the input signal Vl fairly closely. The signal Va in FIG. 4 is characteristic of a critically damped system.

As can be seen when comparing the signals Va in FIGS. 2–4, the signal which appears to minimize reflections and ringing with minimal delay is the signal which closely follows the input signal V1, which is the one characteristic of the critically damped system of FIG. 4. The system of FIG. 4 is the case where there are still reflections at node N2, but the line resistance R is high enough to provide sufficient resistance, but not so high that the signal would be excessively delayed. Thus it is shown that the optimum choice would be for the resistance of the line R to have a resistance which equals $(4L/C)^{1/2}$, where L is the inductance of the line and C is the capacitance of the line, that is $R=(4L/C)^{1/2}$. A circuit with an interconnection line 6 which has a resistance which creates a critically damped system acts to minimize the ringing and reflections received at the destination end.

In order to control the resistance R of the interconnection line 6 to insure a signal at the end of the interconnection line, node N3, with minimized ringing and reflections with minimal delay the geometry of the line must be altered based upon the line resistivity. The geometry of the line includes the line length and cross sectional area. The resistance R of the line 6 is dependant upon the resistivity r, line length l and cross sectional area A of the line. The resistance R is equal to the resistivity r multiplied by the line length l where both are divided by the cross sectional area A, that is, $R=rl/A$. By knowing the interconnection line 6 resistivity and the source output impedance Zs of a circuit, a resistance R can be determined which will insure high signal quality with minimal delay.

In order to obtain the line resistance R the interconnection line 6 must be altered by changing the interconnection line 6 resistivity r, length l, or cross sectional area A. Once the interconnection line 6 with a proper resistivity r, length l, and cross sectional area A are determined the interconnection line is coupled to the signal source 5 and destination point D1, for example as seen in FIG. 1.

The way this technique is typically used is to find the required resistance R of the interconnection line 6 and to find the required length l to reach the destination point of the interconnection line 6 and signal. Then the resistivity and cross sectional area A of the interconnection line 6 are selected or modified to satisfy the line relationship, which will produce an interconnection line 6 which maintains signal quality by minimizing ringing and reflections, as discussed above.

Figure 5:
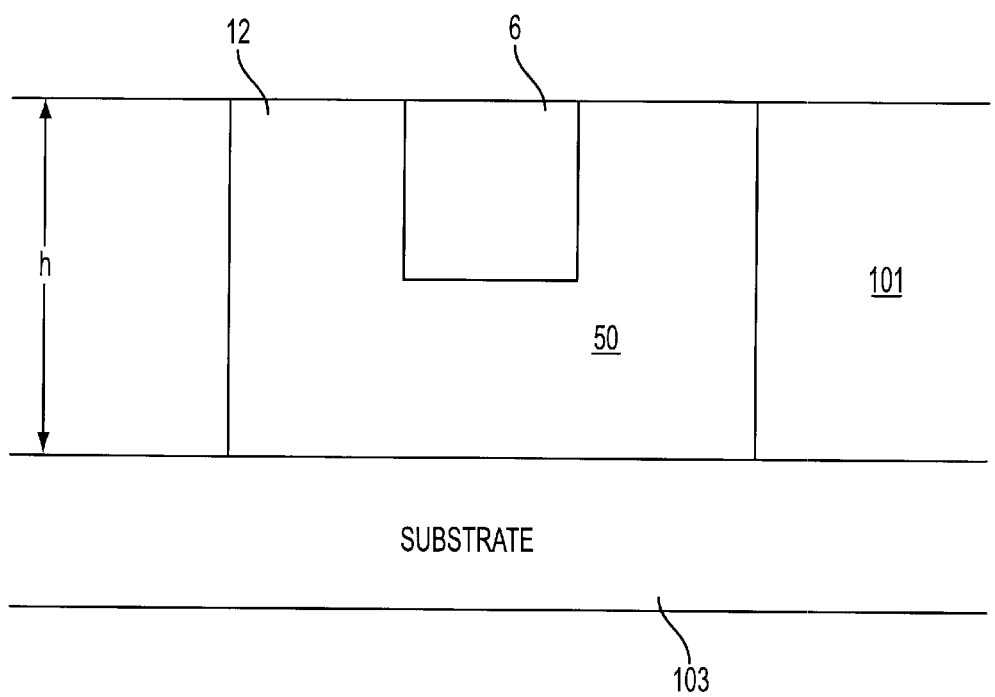
FIG. 5 is a diagram of a low loss transmission line in a trench located in an integrated circuit.

FIG. 5, is an illustration of a typical interconnection line 6 located on an integrated circuit and its construction. The interconnection line 6 is located within a trench 12, where the trench 12 is formed within an insulating layer 101 of insulating material 50, of an integrated circuit. FIG. 5 shows the layer 101 as having a substrate 103 which itself may be formed of one or more material layers. The trench 12 has a depth (h) which varies in accordance with requirements of a particular application. The interconnection line 6 can be supported by posts (not shown) or an insulator material 50 having a low k-dielectric constant such as oxide or porous oxide.

The technology of constructing interconnection lines 6 within a trench 12 of an integrated circuit are discussed in several articles from the IEEE IEDM Technical Digest of 1997 including: D. Edlestein, et al, "Full Copper Wiring in a Sub-0.25 µm CMOS ULSI Technology, p. 773–776; S. Venkatesan, et al, "A High Performance 1.8 v, 0.2 µm CMOS Technology with Copper Metalization", p. 769–772; M. Matsuura, et al, "A Highly Reliable Self-planarizing Low-k Intermetal Dielectric for Sub-quarter Micron Interconnects, p. 785–788; and H. Aoki, et al, "A Degradation-free Cu/HSQ Damascene Technology using Metal Mask Patterning and Post-CMP Cleaning by Electrolytic Ionized Water, p. 777–781 which are all incorporated herein by reference.

The invention may be employed in digital as well as analog integrated circuits. For example, considering digital integrated circuits the invention may be employed in logic devices, including programmable logic devices, such as microprocessors, DSP, memory circuits, ASICs, as well as other.

Figure 6:
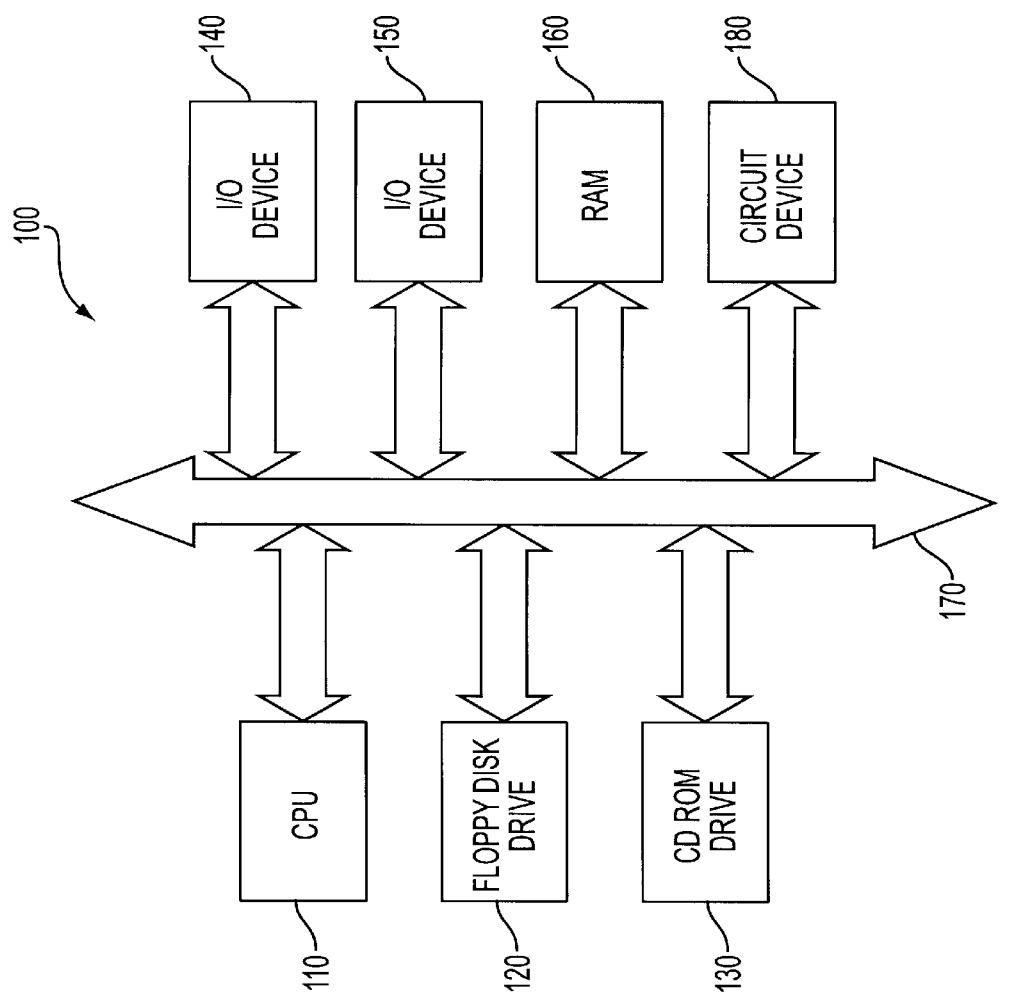
FIG. 6 illustrates in block diagram form a processor system in which a circuit device constructed in accordance with the present invention can be used.

A typical processor based system which includes interconnection lines 6 constructed according to the present invention is illustrated generally at 100 in FIG. 6. The processor based system 100, such as a computer system, for example, generally comprises a central processing unit (CPU) 110, for example, a microprocessor, that communicates with one or more input/output (I/O) devices 140, 150 over a bus 170. The processor system 100 also includes random access memory (RAM) 160, and, in the case of a computer system may include peripheral devices such as a floppy disk drive 120 and a compact disk (CD) ROM drive 130 which also communicate with CPU 110 over the bus 170. It may also be desirable to integrate the processor 110 and memory 160 on a single IC chip. The invention may be employed in the processor or in RAM memory 160.

Also, although the invention has been described as pertaining to minimizing reflections and ringing with minimal delay of signals within an integrated circuit the same method, apparatus, and technique could be applied to interconnections within a printed circuit board.

The above descriptions and drawings illustrate preferred embodiments which achieve the objects, features, and advantages of the present invention. It is not intended that the present invention be limited to the illustrated embodiments. Any modifications of the present invention which comes within the spirit and scope of the following claims should be considered part of the present invention.

What is claimed as new and desired to be protected by Letters Patent of the United States is:

1. A method for reducing signal reflections, ringing and delay on an interconnection line provided within a CMOS integrated circuit, said method comprising:

generating at least one signal and transmitting said signal through at least one said interconnection line having a first end and a second end, said interconnection line having a resistance R and a geometry such that said resistance R is substantially equal to the square root of the total of 4 times the line inductance divided by the line capacitance.

2. A circuit for reducing reflections, ringing and delay on interconnection lines comprising:

a signal source;

at least one interconnection line having a first end coupled to said signal source and a second end coupled to a destination point; and said at least one interconnection line having a resistance R and a geometry such that said resistance R is substantially equal to the square root of the total of 4 times the line inductance divided by the line capacitance.

3. The circuit of claim 2, wherein said circuit is provided within an integrated circuit.

4. The circuit of claim 2, wherein said circuit is provided on a circuit board.

5. The circuit of claim 2, wherein said signal source has an output impedance which is smaller than an impedance of said at least one interconnection line.

6. The circuit of claim 2, wherein said signal source has an output impedance which is substantially equal to an impedance of said at least one interconnection line.

7. The circuit of claim 2, wherein said at least one interconnection line is an interconnection line which is provided within a CMOS integrated circuit.

8. A computer system comprising:

a processor; and a memory circuit coupled to said processor;

wherein at least one of said processor and memory circuit comprise:

a signal source;

at least one interconnection line having a first end coupled to said signal source and a second end coupled to a destination point; and said at least one interconnection line having a resistance R and a geometry such that said resistance R is substantially equal to the square root of the total of 4 times the line inductance L divided by the line capacitance C.

9. The computer system of claim 8, wherein said processor has said signal source and said at least one interconnection line.

10. The computer system of claim 8, wherein said memory circuit has said signal source and said at least one interconnection line.

11. The computer system of claim 8, wherein said signal source has an output impedance which is smaller than an impedance of said at least one interconnection line.

12. The computer system of claim 8, wherein said signal source has an output impedance which is substantially equal to an impedance of said at least one interconnection line.

13. The computer system of claim 8, wherein said interconnection line is provided within a CMOS integrated circuit.

* * * * *